(12) United States Patent
Matsuda et al.

(10) Patent No.: US 9,287,481 B2
(45) Date of Patent: Mar. 15, 2016

(54) VERTICAL NITRIDE SEMICONDUCTOR DEVICE AND METHOD FOR MANUFACTURING SAME

(71) Applicant: NICHIA CORPORATION, Anan-shi, Tokushima (JP)

(72) Inventors: Yoshikazu Matsuda, Komatsushima (JP); Kazuto Okamoto, Tokushima (JP)

(73) Assignee: NICHIA CORPORATION, Anan-Shi, Tokushima (JP)

( * ) Notice: Subject to any disclaimer, the term of this patent is extended or adjusted under 35 U.S.C. 154(b) by 0 days.

(21) Appl. No.: 14/826,283

(22) Filed: Aug. 14, 2015

(65) Prior Publication Data

US 2015/0357539 A1 Dec. 10, 2015

Related U.S. Application Data

(62) Division of application No. 13/850,614, filed on Mar. 26, 2013, now Pat. No. 9,196,793.

(30) Foreign Application Priority Data

Mar. 27, 2012 (JP) .................................. 2012-072442

(51) Int. Cl.
*H01L 33/00* (2010.01)
*H01L 29/18* (2006.01)
(Continued)

(52) U.S. Cl.
CPC .............. *H01L 33/642* (2013.01); *H01L 33/32* (2013.01); *H01L 33/40* (2013.01); *H01L 33/60* (2013.01); *H01L 33/641* (2013.01)

(58) Field of Classification Search
CPC ...................... H01L 33/00; H01L 21/02–21/00

USPC .............. 257/99, 94, 76, 103, 98, 88, E33.06, 257/E33.023; 438/46, 47, 406
See application file for complete search history.

(56) References Cited

U.S. PATENT DOCUMENTS

2006/0043387 A1* 3/2006 Hata .............................. 257/79
2006/0226434 A1* 10/2006 Hata .............................. 257/94
(Continued)

FOREIGN PATENT DOCUMENTS

JP 2001-007394 A 1/2001
JP 2006-319311 A 11/2006

OTHER PUBLICATIONS

Hata; Toshio, Nitride-based semiconductor light emitting device and manufacturing method thereof, Nov. 2006, JP2006-319311, whole reference-translation. (No copy provided, per MPEP 609. Copy submitted in parent U.S. Appl. No. 13/850,614).
(Continued)

*Primary Examiner* — Amar Movva
*Assistant Examiner* — Sheikh Maruf
(74) *Attorney, Agent, or Firm* — Squire Patton Boggs (US) LLP

(57) ABSTRACT

Disclosed is a vertical nitride semiconductor device including a conductive substrate; a semiconductor layer bonded to the conductive substrate via a second electrode; a metal layer formed on the conductive substrate; a first electrode formed on the semiconductor layer; and a bonding layer formed between the conductive substrate and the second electrode. The conductive substrate has a flange part, which extends from a side surface of the conductive substrate, on a side of the other front surface thereof. The flange part is formed in a manner in which the conductive substrate and the semiconductor layer are bonded together and then a remaining part of the conductive substrate is divided, the remaining part being formed by cutting off the semiconductor layer and part of the conductive substrate in a thickness direction so as to expose a side surface of the semiconductor layer and the side surface of the conductive substrate.

15 Claims, 4 Drawing Sheets

(51) Int. Cl.
  *H01L 33/64* (2010.01)
  *H01L 33/32* (2010.01)
  *H01L 33/40* (2010.01)
  *H01L 33/60* (2010.01)

(56) References Cited

U.S. PATENT DOCUMENTS

| 2009/0079024 A1* | 3/2009 | Yamazaki | 257/506 |
| 2009/0079025 A1* | 3/2009 | Yamazaki | 257/506 |
| 2009/0081844 A1* | 3/2009 | Yamazaki | 438/406 |
| 2009/0096054 A1* | 4/2009 | Yamazaki et al. | 257/506 |
| 2009/0115029 A1* | 5/2009 | Koyama et al. | 257/632 |
| 2009/0170286 A1* | 7/2009 | Tsukamoto et al. | 438/458 |
| 2011/0142090 A1* | 6/2011 | Yokozeki et al. | 372/46.012 |
| 2011/0186892 A1* | 8/2011 | Jeong | 257/98 |
| 2011/0316049 A1* | 12/2011 | Sugimoto et al. | 257/194 |
| 2012/0146081 A1* | 6/2012 | Lee | 257/98 |
| 2012/0319161 A1* | 12/2012 | Gotoda et al. | 257/103 |

OTHER PUBLICATIONS

U.S. Notice of Allowance U.S. Appl. No. 13/850,614 mailed Aug. 28, 2015.

* cited by examiner

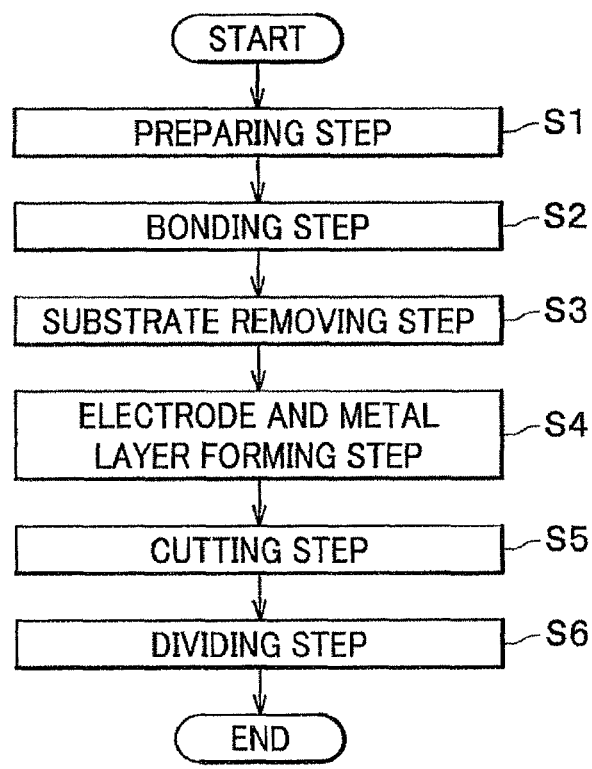

VERTICAL NITRIDE SEMICONDUCTOR DEVICE AND METHOD FOR MANUFACTURING SAME

CROSS REFERENCE TO RELATED APPLICATION

The present application is a divisional application of U.S. patent application Ser. No. 13/850,614 filed on Mar. 26, 2013, which claims benefit of the filing date of Japanese Patent Application No. 2012-072442 filed on Mar. 27, 2012, the disclosures of which are incorporated herein by reference.

BACKGROUND OF THE INVENTION

1. Field of the Invention

The present invention relates to a nitride semiconductor device for a light-emitting diode (LED), a laser diode (LD), or the like and, in particular, to a high-efficiency high-output vertical nitride semiconductor device and a method for manufacturing the same.

2. Description of the Related Art

Known nitride semiconductor devices for light-emitting diodes or the like include one in which an n-type semiconductor layer, an active layer, and a p-type semiconductor layer each made of nitride are laminated on a sapphire substrate one on another. Since the sapphire substrate is insulative and thus electrodes may not be removed from the side of the substrate, such a semiconductor device is a so-called horizontal nitride semiconductor device having the positive electrode and the negative electrode provided on the same surface of a nitride semiconductor layer.

In recent years, there has been an increased demand for high-efficiency high-output nitride semiconductor devices. However, high-output semiconductor devices are likely to generate a large amount of heat. Particularly, in the above horizontal nitride semiconductor device, the horizontal arrangement of the positive electrode and the negative electrode results in the horizontal flow of a current, a local increase in the current density, and an increase in the amount of heat generation. As a result, it is not possible to achieve a high efficiency and a high output with the horizontal nitride semiconductor device.

In view of the above, semiconductor device structures allowing the efficient radiation of heat from semiconductor devices have been demanded in order to achieve a high efficiency and a high output, and thus so-called vertical nitride semiconductor devices have been developed. Here, the vertical nitride semiconductor devices refer to those having a semiconductor device structure in which two electrodes are arranged in the vertical direction so as to face each other with a conductive substrate and a semiconductor layer interposed therebetween.

For example, JP 2001-007394 A describes a vertical nitride semiconductor device in which an n-GaN buffer layer, an n-AlGaN clad layer, an n-GaN guide layer, an active layer having a multiple quantum well structure made of InGaN, a p-GaN light guide layer, a p-AlGaN clad layer, and a p-GaN cap layer each serving as a semiconductor layer are laminated and bonded together on a conductive n-AlGaN single crystal substrate one on another, a p-side ohmic electrode is formed on the p-GaN cap layer, and an n-side ohmic electrode is formed on the bottom surface of the n-AlGaN single crystal substrate.

In addition, JP 2006-319311 A describes a nitride-based semiconductor light-emitting device in which a pattern surface formed on a conductive substrate, a multi-layered metal layer formed on the pattern surface, and a multi-layered semiconductor layer formed on the multi-layered metal layer are included and the areas of the principal surfaces of the multi-layered metal layer and the multi-layered semiconductor layer are smaller than that of the pattern surface. A method for manufacturing the nitride-based semiconductor light-emitting device includes bonding together a block having the conductive substrate with a groove and the small substrate-side multi-layered metal layer provided on the conductive substrate and a block having a base substrate and the multi-layered semiconductor layer and semiconductor-side multi-layered metal layer provided on the base substrate; removing the base substrate; and dividing an object obtained by boding the blocks together into chip-like pieces at a region where the semiconductor-side multi-layered metal layer and the substrate-side multi-layered metal layer are not bonded (non-bonded region).

SUMMARY OF THE INVENTION

However, since the entire surface of the conductive substrate and the entire surface of the semiconductor layer are bonded together in the vertical nitride semiconductor device described in JP 2001-007394 A, the area of the bottom surface of the conductive substrate on the side of a package becomes equal to the bonding area of the semiconductor layer when the semiconductor device is mounted and used. As a result, it is not possible to sufficiently radiate heat generated from the semiconductor layer at the bottom surface of the conductive substrate and achieve a high efficiency and a high output.

In addition, as for the nitride-based semiconductor light-emitting device described in JP 2006-319311 A, the object is divided at the non-bonded region of the semiconductor-side multi-layered metal layer and the substrate-side multi-layered metal layer. Therefore, the principal surfaces of the multi-layered metal layer and the multi-layered semiconductor layer become smaller than that of the pattern surface, which results in a small light-emitting area. Moreover, the method for manufacturing the nitride-based semiconductor light-emitting device is complicated.

The present invention has been made in view of the above problems and has an object of providing a vertical nitride semiconductor device capable of sufficiently radiating heat from a conductive substrate, improving the adhesion between a package and the conductive substrate, and achieving a high efficiency and a high output and a method for manufacturing the same.

In order to solve the above problems, a vertical nitride semiconductor device according to an embodiment of the present invention includes a conductive substrate; a semiconductor layer bonded to a side of one front surface of the conductive substrate via a second electrode and made of nitride; a metal layer formed on the other front surface of the conductive substrate; a first electrode formed on a front surface facing a bonding front surface of the semiconductor layer; and a bonding layer formed between the conductive substrate and the second electrode and made of an electrode material or a conductive material. The conductive substrate has a flange part, which extends from a side surface of the conductive substrate, on a side of the other front surface thereof. The flange part is formed in a manner in which the conductive substrate and the semiconductor layer are bonded together and then a remaining part of the conductive substrate is divided, the remaining part being formed by cutting off the semiconductor layer and part of the conductive substrate in a thickness direction so as to expose a side surface of the semiconductor layer and the side surface of the conductive substrate. Preferably, the bonding layer includes at least one of a first bonding layer formed on a front surface of the second electrode and a second bonding layer formed on the one front surface of the conductive substrate.

According to the above configuration, the conductive substrate has the flange part, which extends from the side surface of the conductive substrate, on the side of the other front surface thereof such that the area of the other front surface of the conductive substrate becomes larger than that of the bonding front surface of the semiconductor layer. The flange part is formed in a manner in which the conductive substrate and the semiconductor layer are bonded together and then the remaining part of the conductive substrate is divided, the remaining part being formed by cutting off the semiconductor layer and part of the conductive substrate in the thickness direction so as to expose the side surface of the semiconductor layer and the side surface of the conductive substrate. Therefore, the area of the other front surface (bottom surface) of the conductive substrate becomes larger than that of the bonding front surface of the semiconductor layer. As a result, heat radiation is improved at the bottom surface of the conductive substrate on the side of a package and an increase in the temperature of the semiconductor layer is reduced when the semiconductor device is mounted and used. In addition, the adhesion between the package and the conductive substrate is improved.

In addition, a method for manufacturing the vertical nitride semiconductor device according to the embodiment of the present invention includes preparing a conductive substrate and a semiconductor layer and forming a bonding layer on at least one of the conductive substrate and a second electrode, the semiconductor layer being formed on a front surface of an insulating substrate, having the second electrode bonded thereto, and being made of nitride; bonding the semiconductor layer prepared in the preparing step to one front surface of the conductive substrate via the bonding layer; removing the insulating substrate from the semiconductor layer; forming a first electrode on the semiconductor layer and forming a metal layer on the conductive substrate; cutting off the semiconductor layer from which the insulating substrate is removed and part of the conductive substrate in a thickness direction so as to expose a side surface of the semiconductor layer and a side surface of the conductive substrate, thereby forming a plurality of remaining parts of the conductive substrate to manufacture a plurality of laminating devices connected to each other by the remaining parts of the conductive substrate; and dividing the remaining parts of the conductive substrate to manufacture the plurality of vertical nitride semiconductor devices each having a flange part.

According to the above procedure, the flange part extending from the side surface is formed on the side of the other front surface of the conductive substrate by the cutting step and the dividing step. Therefore, the area of the other front surface (bottom surface) of the conductive substrate becomes larger than that of the bonding front surface of the semiconductor layer. As a result, heat radiation is improved at the bottom surface of the conductive substrate on the side of a package and an increase in the temperature of the semiconductor layer is reduced when the semiconductor device is mounted and used. In addition, the adhesion between the package and the conductive substrate is improved.

Preferably, the dividing step includes forming cut lines in the remaining parts of the conductive substrate from the side of the other front surface of the conductive substrate, thereby dividing the laminating devices. Thus, it is possible to prevent a mounting-side electrode from protruding more than necessary.

According to a vertical nitride semiconductor device of an embodiment of the present invention, heat is sufficiently radiated from a conductive substrate, and the adhesion between a package and the conductive substrate is excellent. Therefore, it is possible to achieve a high efficiency and a high output. In addition, according to a method for manufacturing the vertical nitride semiconductor device of the embodiment of the present invention, it is possible to provide the vertical nitride semiconductor device that achieves a high efficiency and a high output since heat is sufficiently radiated from the conductive substrate and the adhesion between the package and the conductive substrate is excellent.

BRIEF DESCRIPTION OF THE DRAWINGS

FIG. 3 is a flowchart showing a method for manufacturing the vertical nitride semiconductor device according to the embodiment of the present invention;

DETAILED DESCRIPTION OF THE PREFERRED EMBODIMENT (Vertical Nitride Semiconductor Device)

A description will be given, with reference to the drawings, of a vertical nitride semiconductor device according to an embodiment of the present invention.

Figure 1:
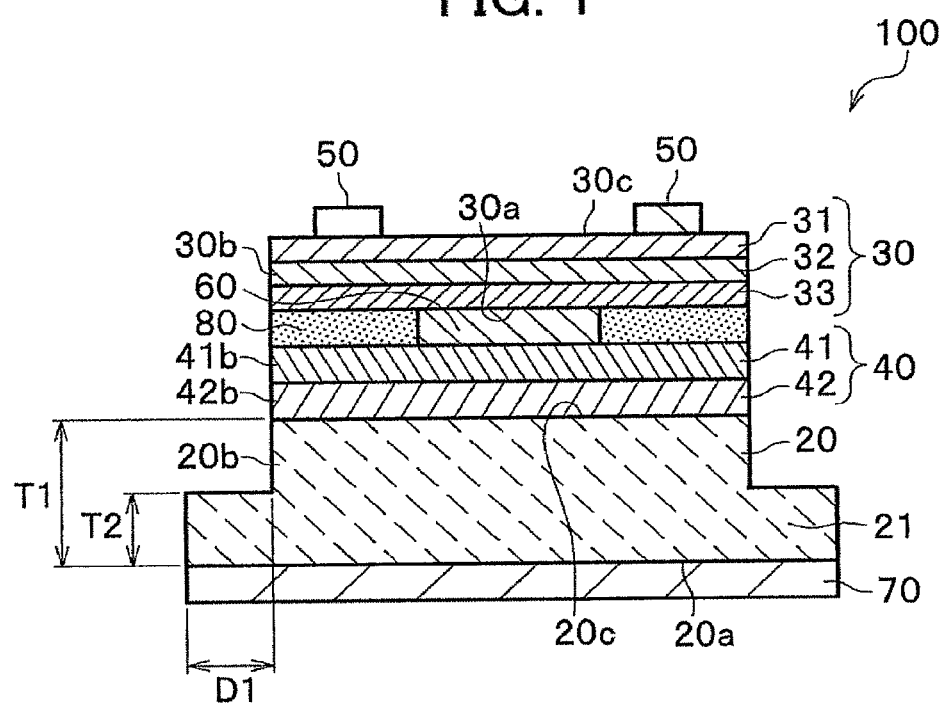
FIG. 1 is a cross-sectional view schematically showing the configuration of a vertical nitride semiconductor device according to an embodiment of the present invention.

As shown in FIG. 1, a vertical nitride semiconductor device 100 has a conductive substrate 20, a semiconductive layer 30, a metal layer 70, a first electrode 50, a second electrode 60, and a bonding layer 40. In addition, the conductive substrate 20 has a flange part 21.

Note that according to the embodiment of the present invention, the vertical nitride semiconductor device 100 refers to one having a semiconductor device structure in which the first electrode 50, the second electrode 60, and the metal layer 70 are arranged in the vertical direction (laminating direction) so as to face each other with the conductive substrate 20 and the semiconductor layer 30 interposed therebetween.

Next, a description will be given of each configuration of the vertical nitride semiconductor device (hereinafter referred to as the semiconductor device) 100.

(Conductive Substrate)

The conductive substrate 20 is a wafer-like substrate made of a conductive material. Examples of the conductive material include Si, SiC, GaAs, GaP, InP, ZnSe, ZnS, ZnO, CuW, or the like. Among them, CuW or the like excellent in heat radiation is preferable.

The conductive substrate 20 has the flange part 21, which extends outward from a side surface 20$b$ of the conductive substrate 20, on the side of a bottom surface 20$a$ thereof. An area M2 of the bottom surface 20a becomes larger than an area M1 of a bonding front surface 30a of the semiconductor layer 30. Since the conductive substrate 20 has the flange part 21 and the area M2 of the bottom surface 20a becomes larger in size, heat radiation is improved at the bottom surface 20a of the conductive substrate 20 on the side of a package (not shown) and an increase in the temperature of the semiconductor layer 30 is reduced when the semiconductor device 100 is mounted and used. In addition, the adhesion between the package and the conductive substrate 20 is improved.

A thickness T1 of the conductive substrate 20 is not particularly limited but is preferably in the range of 100 μm to 500 μm. In addition, a thickness T2 of the flange part 21 is preferably in the range of 10 μm to 100 μm if the conductive substrate 20 is made of CuW.

Figure 2A:
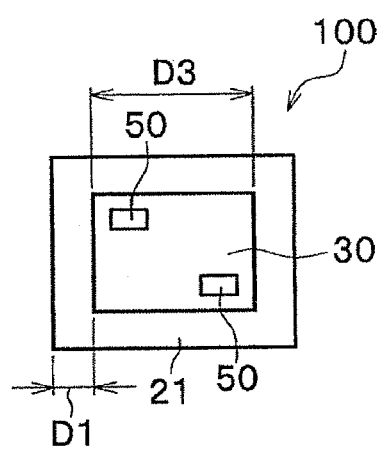
FIG. 2A is a plan view schematically showing the configuration of the vertical nitride semiconductor device shown in FIG. 1.

As shown in FIG. 2A, an extending length D1 of the flange part 21 is preferably 0.1 to 0.5 times as large as a length D3 of one side of the semiconductor layer 30 and more preferably in the range of 10 μm to 100 μm. Thus, it is possible to efficiently transfer heat from the semiconductor layer 30 to the side of a mounting substrate and improve heat radiation.

Figure 2B:
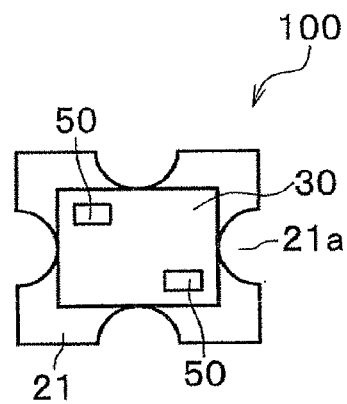
FIG. 2B is a plan view schematically showing another shape of a flange part.

As shown in FIG. 2B, the flange part 21 may have notches 21a at some parts thereof. The positions and shapes of the notches are not particularly limited, but at least one semicircular or rectangular notch 21a may be formed at the substantially central area other than the four corners of the periphery of the flange part 21.

As will be described in detail later in the column of a method for manufacturing the semiconductor device 100, the flange part 21 is formed in the following manner. That is, as shown in FIGS. 4 and 5, the conductive substrate 20 and the semiconductor layer 30 are first bonded together. Then, the semiconductor layer 30 is etched and part of the conductive substrate 20 is cut off in the thickness direction so as to expose a side surface 30b of the semiconductor layer 30 and a side surface 20b of the conductive substrate 20, thereby forming a remaining part 22 of the conductive substrate 20. Finally, the remaining part 22 is divided into pieces to form the flange part 21.

If the flange part 21 is not formed at the conductive substrate 20 and the conductive substrate 20 is entirely cut off only by a dicer, burrs are caused at the end surface of the conductive substrate 20. Conversely, if part of the conductive substrate 20 is cut off by a dicer to form the remaining part 22 and the remaining part 22 is divided into pieces by breaking equipment or the like along the cut line thereof to form the flange part 21 (see FIG. 5C), it is possible to prevent burrs from being caused at the end surface of the conductive substrate 20.

(Semiconductive Layer)

The semiconductor layer 30 is bonded to one front surface 20c of the conductive substrate 20 via the second electrode 60 and the bonding layer 40, which will be described later, and serves as a semiconductor made of nitride. Preferably, the semiconductor layer 30 has a double heterostructure in which the three layers of an n-type semiconductor layer 31 doped with a donor impurity, an active layer 32 exhibiting a light-emitting effect, and a p-type semiconductor layer 33 doped with an acceptor impurity are laminated in this order one on another. Note that each of the n-type semiconductor layer 31, the active layer 32, and the p-type semiconductor layer 33 is not limited to a single layer but may include two or more layers.

As will be described later, the semiconductor layer 30 is formed on the front surface of an insulating substrate 10, and the insulating substrate 10 is removed from the semiconductor layer 30 after the conductive substrate 20 and the semiconductor layer 30 are bonded together.

(Insulating Substrate)

The insulating substrate 10 is a wafer-like substrate and substantially the same in size as the conductive substrate 20. Examples of the substrate material of the insulating substrate 10 include sapphire, spinel, lithium niobate, neodymium gallate, or the like. Among them, sapphire and spinel are preferable to improve the crystallinity of the semiconductor layer 30 formed on the front surface of the insulating substrate 10.

(Metal Layer)

The metal layer 70 is formed on the other front surface 20a of the conductive substrate 20 and electrically connected to an external power supply via a wire or the like to supply a current to the conductive substrate 20. In addition, the metal layer 70 is made of a metal material such as Au—Sn.

(Electrodes)

The semiconductor device 100 has the second electrode 60 formed on the bonding front surface 30a of the semiconductor layer 30 and the first electrode 50 formed on a front surface 30c facing the bonding front surface 30a. The first electrode 50 is an n-side electrode electrically connected to the n-type semiconductor layer 31 of the semiconductor layer 30. In addition, the second electrode 60 is a p-side electrode electrically connected to the n-type semiconductor layer 33 of the semiconductor layer 30. Moreover, both the side surfaces of the second electrode (p-side electrode) 60 are preferably covered with an insulating film 80 made of $SiO_2$ or the like. As described above, the semiconductor device 100 has the first electrode (n-side electrode) 50, the second electrode (p-side electrode) 60, and the metal layer 70 in the vertical direction (laminating direction) thereof and is connected to an external power supply (not shown) via a wire or the like. Thus, since a current is supplied in the vertical direction of the semiconductor device 100, the semiconductor device 100 serves as a vertical semiconductor device that generates less heat than a horizontal semiconductor device.

The first electrode (n-side electrode) 50 is preferably a multi-layered electrode of Ti—Al—Ni—Au or W—Al—W—Pt—Au and preferably has a thickness of 0.1 μm to 3.0 μm. The second electrode (p-side electrode) 60 is preferably made of a metal material containing at least one material selected from a group including Ag, Rh, Ni, Au, Pd, Ir, Ti, Pt, W, and Al and preferably has a thickness of 0.05 μm to 1.0 μm.

(Bonding Layer)

The bonding layer 40 is formed between the conductive substrate 20 and the semiconductor layer 30 (second electrode 60) and made of an electrode material or a conductive material. In addition, the bonding layer 40 preferably includes at least one of a first bonding layer 41 formed on the front surface of the second electrode 60 and the insulating film 80 each provided on the semiconductor layer 30 and a second bonding layer 42 formed on the one front surface 20c of the conductive substrate 20, i.e., the second bonding layer 42 formed on the front surface of the conductive substrate 20 on the side where the conductive substrate 20 is bonded to the semiconductor layer 30. Note that FIG. 1 shows a case in which both the layers are formed on the corresponding front surfaces. In addition, the thicknesses of the first bonding layer 41, the second bonding layer 42, and the bonding layer 40 are not particularly limited, but the total thickness of the first bonding layer 41 and the second bonding layer 42 is preferably in the range of 10 μm to 30 μm. Examples of the conductive material of the bonding layer 40 include Au—Sn, Au, Pt, Ti, or the like.

Figure 5A:
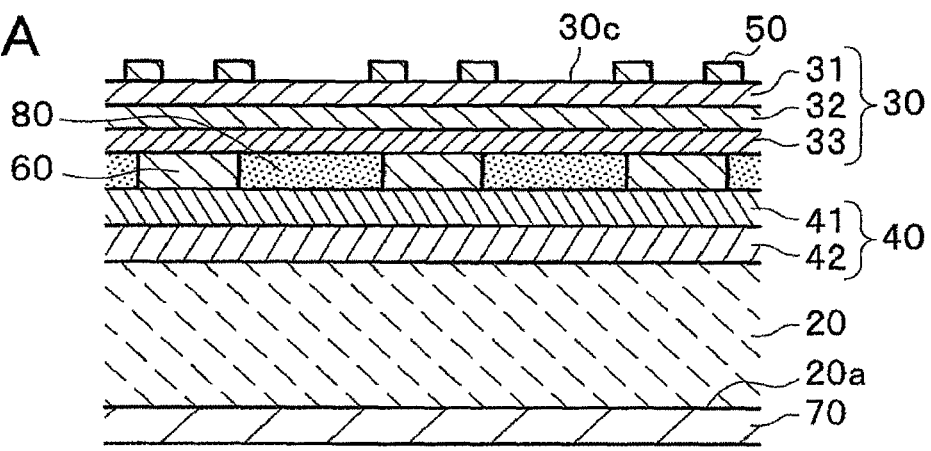
FIGS. 5A to 5C are plan views schematically showing another part of the manufacturing process for the vertical nitride semiconductor device according to the embodiment of the present invention.
Figure 5B:
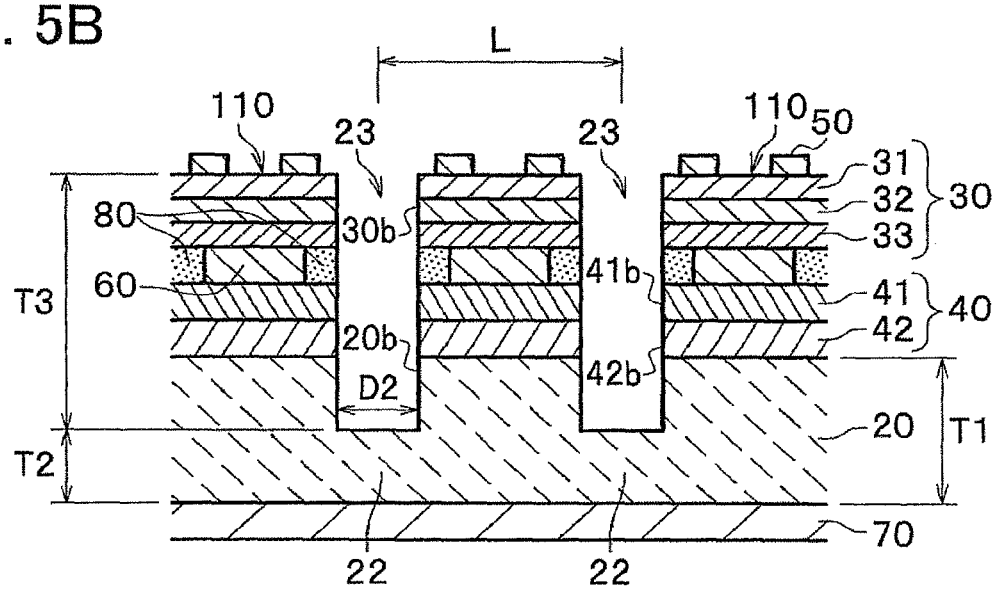

After the conductive substrate 20 and the semiconductor layer 30 are bonded together via the bonding layer 40, the semiconductor layer 30 is etched and then the bonding layer 40 is cut off in the thickness direction together with the insulating film 80 and part of the conductive substrate 20 so as to expose the side surfaces 41b and 42b of the bonding layer 40 at the formation of the flange part 21 at the conductive substrate 20 (see FIG. 5B).

(Method for Manufacturing Vertical Nitride Semiconductor Device)

Next, a description will be given, with reference to the drawings, of the method for manufacturing the vertical nitride semiconductor device according to the embodiment of the present invention.

As shown in FIG. 3, the method for manufacturing the vertical nitride semiconductor device includes a preparing step S1, a bonding step S2, a substrate removing step S3, an electrode and metal layer forming step S4, a cutting step S5, and a dividing step S6. Next, each of the steps will be described.

(Preparing Step)

Figure 4A:
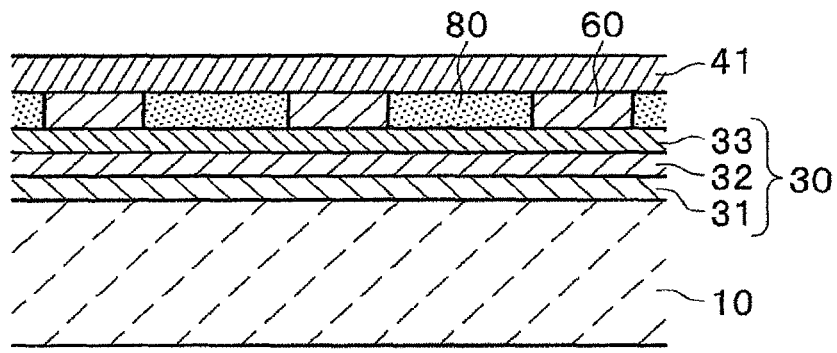
FIGS. 4A to 4C are plan views schematically showing part of a manufacturing process for the vertical nitride semiconductor device according to the embodiment of the present invention.
Figure 4B:
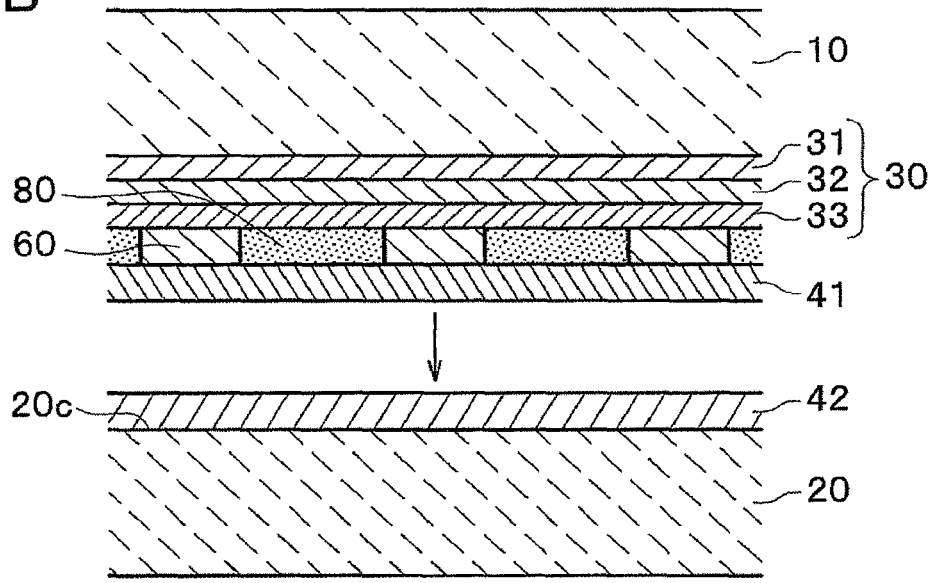

In the preparing step S1, as shown in FIGS. 4A and 4B, the semiconductor layer 30 made of nitride formed on the insulating substrate 10 made of sapphire or the like and the conductive substrate 20 are prepared, and the bonding layer 40 is formed on at least one of the semiconductor layer 30 (second electrode 60) and the conductive substrate 20. Note that it is preferable to form the second electrode 60 and the insulating film 80 on the semiconductor layer 30, form the first bonding layer 41 on the second electrode 60 and the insulating film 80, and form the second bonding layer 42 on the conductive substrate 20.

Although either of the first bonding layer 41 and the second bonding layer 42 may be used alone, the embodiment therein describes a case in which both the layers are used.

Both the first bonding layer 41 and the second bonding layer 42 may be formed by a sputtering method, a vacuum deposition method, a chemical vapor-phase epitaxial method, or the like.

A method for forming the semiconductor layer 30 is not particularly limited so long as the semiconductor layer 30 is formed on the front surface of the insulating substrate 10, but it is preferable to use a vapor-phase epitaxial method such as MBE (Molecular Beam Epitaxy) and MOVPE (Metal Organic Vapor Phase Epitaxy) to form the semiconductor layer 30 excellent in crystallinity. The semiconductor layer 30 is laminated on the insulating substrate 10 made of sapphire or the like in an order of the n-type semiconductor 31 layer, the active layer 32, and the p-type semiconductor layer 33. After that, the second electrode 60 is formed on the p-type semiconductor layer 33, and then the insulating film 80 made of $SiO_2$ or the like is formed at a prescribed position on the p-type semiconductor layer 33.

In addition, before or after the second bonding layer 42 is formed on the conductive substrate 20, the metal layer 70 may be formed on the conductive substrate 20. In this case, the second bonding layer 42 is formed on the one front surface 20c of the conductive substrate 20, and the metal layer 70 is formed on the other front surface 20a thereof.

(Bonding Step)

In the bonding step S2, as shown in FIG. 4B, the semiconductor layer 30 prepared in the previous step is bonded to the side of the one front surface 20c of the conductive substrate 20. Specifically, the first bonding layer 41 provided on the semiconductor layer 30 and the second bonding layer 42 provided on the conductive substrate 20 are bonded together to form the bonding layer 40. A method for bonding the first and second bonding layers 41 and 42 together is not particularly limited so long as the bonding of the conductive substrate 20 and the semiconductor layer 30 is allowed, but a wafer bonding method is preferable for its excellent bonding performance. According to the wafer bonding method, the front surfaces of the first and second bonding layers 41 and 42 are made into mirror surfaces, and the mirror surfaces are heated and crimped after being bonded together. It is also possible to heat and crimp the front surfaces of the first and second bonding layers 41 and 42 without using wafer bonding.

(Substrate Removing Step)

Figure 4C:
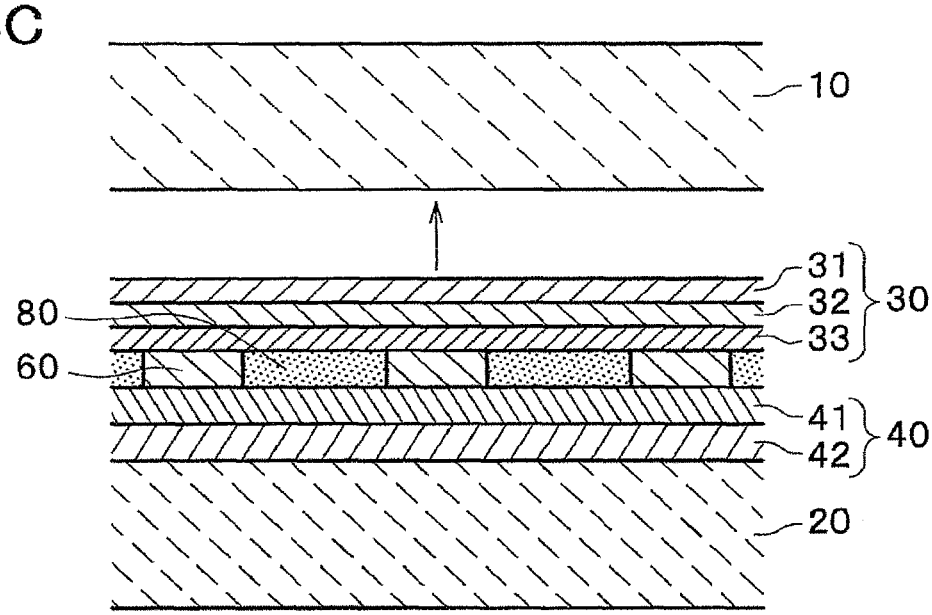

In the substrate removing step S3, as shown in FIG. 4C, the insulating substrate 10 is removed from the semiconductor layer 30 bonded in the previous step.

A method for removing the insulating substrate 10 is not particularly limited so long as the removal of the insulating substrate 10 is allowed. As such, polishing, etching, radio wave irradiation, or a combination of these methods may be used. Among them, the radio wave irradiation using a laser is preferable for its excellent workability. According to laser irradiation, a laser is irradiated on the entire front surface of the insulating substrate 10 on the side where the semiconductor layer 30 has not been formed to decompose the interface between the insulating substrate 10 and the semiconductor layer 30, thereby making it possible to remove the insulating substrate 10 from the semiconductor layer 30. In addition, the front surface of the semiconductor layer 30 on the side where the insulating substrate 10 has been removed by laser irradiation may be subjected to CMP (Chemical Mechanical Polishing) in order to facilitate the adjustment of the thickness of the semiconductor layer 30 or the formation of the first electrode 50.

(Electrode and Metal Layer Forming Step)

In the electrode and metal layer forming step S4, as shown in FIG. 5A, the first electrode 50 is formed on the front surface 30c facing the bonding front surface 30a of the semiconductor layer 30, and the metal layer 70 is formed on the other front surface (bottom surface) 20a of the conductive substrate 20. The first electrode 50 and the metal layer 70 are separately formed therein but may be simultaneously formed.

A method for forming the first electrode 50 is not particularly limited so long as the formation of the electrode 50 is allowed. As such, a sputtering method, a vacuum deposition method, or a chemical vapor-phase epitaxial method may be used. Among them, the sputtering method is preferable for its excellent workability.

A method for forming the metal layer 70 is not particularly limited, and a sputtering method, a vacuum deposition method, and a chemical vapor-phase epitaxial method may be used as such. Among them, the sputtering method is preferable for its excellent workability. The metal layer 70 is formed on the entire front surface 20a of the conductive substrate 20.

(Cutting Step)

In the cutting step S5, as shown in FIG. 5B, the semiconductor layer 30 from which the insulating substrate 10 has been removed and part of the conductive substrate 20 in the thickness direction are cut off so as to expose the side surface 30b of the semiconductor layer 30 and the side surface 20b of the conductive substrate 20, thereby forming a plurality of the remaining parts 22 of the conductive substrate 20 to manufacture a plurality of laminating devices 110 connected to each other by the remaining parts 22 of the conductive substrate 20.

Specifically, RIE (Reactive Ion Etching) is first applied from the side of the front surface 30c of the semiconductor layer 30, from which the insulating substrate 10 has been removed, to the insulating film 80 made of $SiO_2$ or the like. Then, the insulating film 80, the bonding layer 40, and the conductive substrate 20 are cut off by a dicer or the like. For example, slits are made by a dicer or the like to form kerfs in the thickness direction, and the conductive substrate 20 is partially cut off in the thickness direction so as to leave part of the conductive substrate 20. The kerfs are partially formed in the conductive substrate 20 in the thickness direction as described above, thereby forming a plurality of groove parts 23 making the side surface 30b of the semiconductor layer 30, the side surfaces 41b and 42b of the bonding layer 40, and the side surface 20b of the conductive substrate 20 exposed and forming the plurality of remaining parts 22 of the conductive substrate 20 facing the groove parts 23 to manufacture the plurality of laminating devices 110 connected to each other by the remaining parts 22 of the conductive substrate 20.

An interval L between the groove parts 23 corresponds to the size of the plurality of laminating devices 110 (semiconductor devices) thus manufactured. The interval L is appropriately set so as to suit the size of the laminating devices 110 (semiconductor devices). For example, the interval L is in the range of 0.5 mm to 3.0 mm although it depends on the thickness of the blade of a dicer. In addition, a depth T3 of the groove parts 23 is appropriately set so as to make the thickness of the remaining parts 22 of the conductive substrate 20 being equal to the thickness T2 of the flange parts 21 described above. Here, the thickness of the flange parts 21 is preferably in the range of 10 μm to 100 μm if the conductive substrate 20 is made of CuW.

A method for forming the groove parts 23 is not particularly limited so long as the formation of the groove parts 23 is allowed. As such, electron irradiation, dicing with a dicer, or the like may be used. Among them, the dicing is preferable for its excellent workability. In this case, the width of the dicer corresponds to a width D2 of the groove parts 23. Note that in dicing, the width D2 of the groove parts 23 becomes approximately twice as large as the extending length D1 (see FIG. 1) of the flange parts 21 formed by dividing the remaining parts 22 of the conductive substrate 20. Since the extending length D1 of the flange parts 21 is preferably in the range of 10 μm to 100 μm as described above, the width D2 of the groove parts 23 is preferably in the range of 20 μm to 200 μm.

(Dividing Step)

Figure 5C:
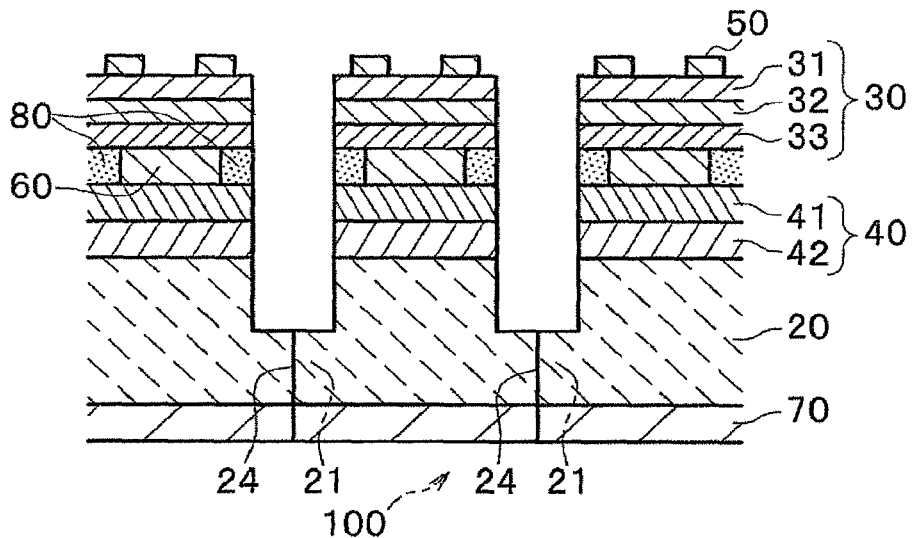

In the dividing step S6, as shown in FIG. 5C, cut lines 24 are formed at the substantially central areas of the remaining parts 22 of the conductive substrate 20 from the side of the other front surface (bottom surface) 20a of the conductive substrate 20. With the cut lines 24, the laminating devices 110 (the remaining parts 22 of the conductive substrate 20) are divided into pieces to manufacture the plurality of semiconductor devices 100 each having the flange part 21.

A method for forming the cut lines 24 (cutting method) is not particularly limited so long as the formation of the cut lines 24 is allowed. As such, a method for hitting the bottom surface 20a of the conductive substrate 20 (the remaining parts 22 of the conductive substrate 20) with a jig or the like may be used. Compared with a method in which the conductive substrate 20 is completely cut off by a dicer or the like and the flange parts 21 are not formed, the above method for dividing the laminating devices 110 (the remaining parts 22 of the conductive substrate 20) into pieces to form the flange parts 21 with the cut lines 24 makes it possible to further prevent burrs from being caused at the end surface of the conductive substrate 20.

In this step, the remaining parts 22 of the conductive substrate 20 are divided with the cut lines 24. Therefore, the extending length D1 (see FIG. 1) of the flange parts 21 of the semiconductor devices 100 thus manufactured becomes approximately half the size of the width D2 (see FIG. 5B) of the groove parts 23. It is preferable to detect the presence or absence of the cut lines 24 with a sensor or the like.

The method for manufacturing the semiconductor devices 100 is described above but may include other steps during or before or after each of the steps at the manufacturing of the semiconductor devices 100 so long as each of the steps is not adversely affected.

For example, a protection film may be formed on the n-type semiconductor layer 31 excluding the first electrode 50. In addition, the protection film may also be formed on the side surface of the semiconductor layer 30, besides the n-type semiconductor layer 31. The protection film forming step may be performed during the electrode and metal layer forming step or may be performed before or after the dividing step.

Furthermore, the embodiment of the present invention is not limited to the one described above but may be modified in various ways without departing from the sprit of the present invention.

What is claimed is:

1. A vertical nitride semiconductor device, comprising:
a conductive substrate having a first surface, a second surface opposite to the first surface and side surfaces;
a semiconductor layer bonded to a side of the first surface of the conductive substrate via a second electrode and made of nitride;
a metal layer formed on the second surface of the conductive substrate;
a first electrode formed on a front surface facing a bonding front surface of the semiconductor layer; and
a bonding layer formed between the conductive substrate and the second electrode and made of an electrode material or a conductive material, wherein
the conductive substrate has a flange part, which extends from the side surfaces of the conductive substrate, on a side of the second surface thereof, wherein
each of at least two of the side surfaces of the conductive substrate on the side of the first surface is flush with a corresponding side surface of the semiconductor layer and a corresponding side surface of the bonding layer and
each of at least two side surfaces of the flange part is flush with a corresponding side surface of the metal layer.

2. The vertical nitride semiconductor device according to claim 1, wherein the bonding layer includes at least one of a first bonding layer formed on a front surface of the second electrode and a second bonding layer formed on the one front surface of the conductive substrate.

3. The vertical nitride semiconductor device according to claim 1, wherein a thickness of the conductive substrate is in the range of 100 μm to 500 μm.

4. The vertical nitride semiconductor device according to claim 1, wherein the conductive substrate is made of CuW.

5. The vertical nitride semiconductor device according to claim 1, wherein an extending length of the flange part is 0.1 to 0.5 times as large as a length of one side of the semiconductor layer.

6. The vertical nitride semiconductor device according to claim 1, wherein an extending length of the flange part is 10 μm to 100 μm.

7. The vertical nitride semiconductor device according to claim 1, wherein the flange part has notches.

8. The vertical nitride semiconductor device according to claim 1, wherein the flange part has at least one semicircular or rectangular notch, the at least one semicircular or rectangular notch formed at a substantially central area other than four corners of a periphery of the flange part.

9. The vertical nitride semiconductor device according to claim 1, wherein the second electrode comprises a metal material containing at least one material selected from a group including Ag, Rh, Ni, Au, Pd, Ir, Ti, Pt, W, and Al.

10. The vertical nitride semiconductor device according to claim 1, wherein a thickness of the bonding layer is in the range of 10 μm to 30 μm.

11. The vertical nitride semiconductor device according to claim 1, wherein the bonding layer is at least one material selected from a group including Au—Sn, Au, PT and Ti.

12. The vertical nitride semiconductor device according to claim 1, wherein side faces of the semiconductor layer and the upper portion of the conducive substrate are coplanar.

13. A vertical nitride semiconductor device, comprising:
   a conductive substrate having a first portion and a second portion and having a flange provided in the second portion,
   a bonding layer disposed on the conductive substrate,
   a second electrode disposed on the bonding layer,
   an insulating layer disposed on the bonding layer, wherein the insulating layer is disposed at a first location on the bonding layer, wherein the first location is different from a second location on the bonding layer at which the second electrode is disposed,
   a semiconductor layer contacted the insulating layer and the second electrode, and
   a first electrode disposed on the semiconductor layer, wherein
   each of at least two side surfaces of the first portion of the conductive substrate is flush with a corresponding side surface of the semiconductor layer and a corresponding side surface of the bonding layer and
   each of at least two side surfaces of the flange is flush with a corresponding side surface of the metal layer.

14. The vertical nitride semiconductor device according to claim 1, wherein the bonding layer has two mirror planes which are bonded together.

15. The vertical nitride semiconductor device according to claim 13, wherein the bonding layer has two mirror planes which are bonded together.

\* \* \* \* \*